United States Patent [19]

Flickinger

[11] Patent Number: 4,924,152
[45] Date of Patent: May 8, 1990

[54] THERMOPLASTIC BALLAST HOUSING IN A NOVEL THREE-DIMENSIONAL PRINTED CIRCUIT BOARD

[76] Inventor: Jon Flickinger, 314 Irene St., Salina, Kans. 67401

[21] Appl. No.: 205,982

[22] Filed: Jun. 13, 1988

[51] Int. Cl.$^5$ .................. H05B 41/00; H05K 1/03; H05K 5/02; H05K 7/14
[52] U.S. Cl. .................. 315/363; 361/397; 361/399; 361/400
[58] Field of Search .............. 315/363; 361/380, 392, 361/395, 397, 399, 400

[56] References Cited

U.S. PATENT DOCUMENTS

| | | | |
|---|---|---|---|
| 4,042,819 | 8/1977 | Decal | 240/51.11 R |
| 4,275,331 | 6/1981 | Stresing | 313/318 |
| 4,338,243 | 7/1982 | Hecht et al. | 524/287 |
| 4,352,539 | 10/1982 | Vest | 339/154 |
| 4,352,904 | 10/1982 | Deyrup | 524/292 |
| 4,379,321 | 4/1983 | Plemmons et al. | 362/267 |
| 4,486,564 | 12/1984 | Deyrup | 524/308 |
| 4,507,719 | 3/1985 | Quiogue | 362/404 |
| 4,563,729 | 1/1986 | Jendrewski | 362/218 |
| 4,752,254 | 6/1988 | Inoue et al. | 361/400 |

OTHER PUBLICATIONS

DuPont, "Rynite", Product Brochure No. E-62737.
Rogers, "DuPont Develops a New Line of Engineering Thermoplastics", *American Metal Market*, vol. 94, Nov. 10, 1986, p. 5(2).
Solenberger, "PET Resins Designed for Electronic-/Electrical Needs", DuPont Brochure No. E-68719.
Wood, "Polyarylate: The New Buildup to 'Workhorse' Status", *Modern Plastics*, Jul. 1987.

*Primary Examiner*—David Mis
*Attorney, Agent, or Firm*—Pollock, Vande Sande & Priddy

[57] ABSTRACT

The present invention relates to an improved three-dimensional printed circuit board and a plastic housing for power conditioning electronics such as fluorescent lamp ballasts. The novel printed circuit board of the invention is a molded printed circuit board which is generally a rectangular parallelepiped having an upper relatively plain surface and a lower relatively plain surface but in addition having integral components thereon which extend for example above the upper relatively plain surface. Such integral components extending in this direction can be used for wire receptacles, module connectors and stand-offs. Suitable materials for the printed circuit board are thermoplastics such as polyarylate, polyethylene, terephthalate, polyimide, polyamide, polyester, polyphenylene sulfone, polyether sulfur, polyether imide and modified polyphenylene oxide. In a specific embodiment described in the application, the printed circuit board is a composite of two thermoplastics, a polyarylate and a polyethylene terephthalate. The invention also comprehends a metalless unpotted housing for an electronic power conditioning apparatus which includes plural thermoplastic housing components fitted together to form a closed integral housing where at least one of the thermoplastic housing components has an aperture for receiving a conductor receptacle, a three-dimensional molded printed circuit board supported within the housing and at least one integrally molded conductor receptacle of the printed circuit board extending from an interior of the housing to an exterior where the molded conductor receptacle includes a conductor receiving aperture, a fixed conductor extending from the conductor receiving aperture to a conductive trace on the printed circuit board.

23 Claims, 5 Drawing Sheets

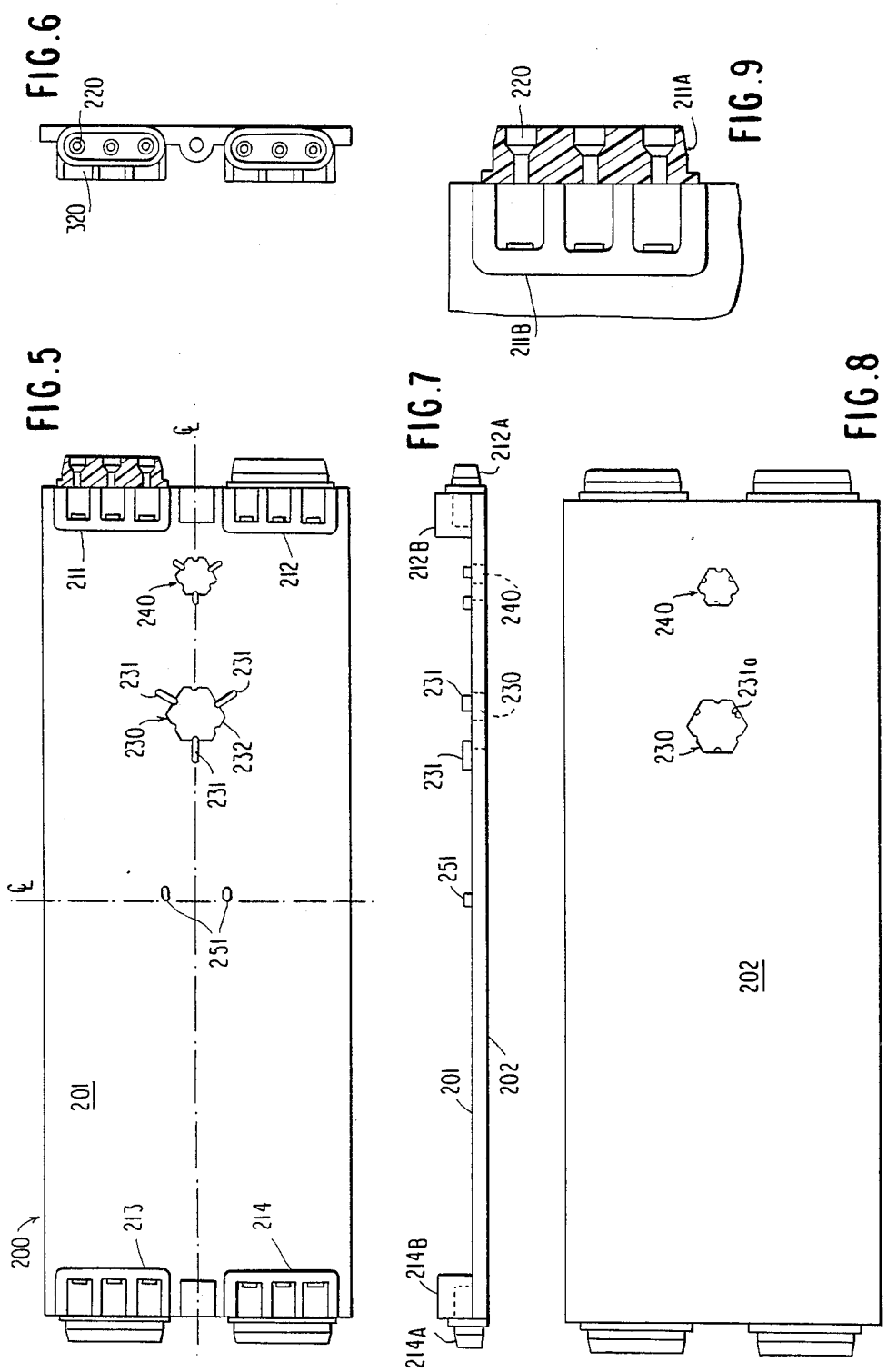

THERMOPLASTIC BALLAST HOUSING IN A NOVEL THREE-DIMENSIONAL PRINTED CIRCUIT BOARD

FIELD OF THE INVENTION

The invention relates to an improved housing for severe duty electronics, such as ballasts for fluorescent lamps. As applied to a ballast, the invention eliminates the necessity for a metal housing, eliminates the potting typically used in such ballasts and employs a novel, three-dimensional printed circuit board.

BACKGROUND ART

Gas vapor discharge lamps, more popularly known as fluorescent lamps, are typically operated from power sources having voltage and frequency different from those typically available. Accordingly, these light sources are typically associated with power conditioning and starting componentry, sometimes popularly referred to as a ballast. Aside from very light duty applications where a simple resistance ballast can be used, the vast majority of such componentry include heavy electrical components such as transformers. In order to meet applicable safety standards, these components are typically enclosed in a housing, and the interior space of the housing is potted. Presently available housings are usually metal, either steel or aluminum, see U.S. Pat. No. 4,042,819. While U.S. Pat. Nos. 4,379,321, 4,507,719 and 4,563,729 show plastic housings, they all include metal plates, pans or brackets for support and/or heat conduction, U.S. Pat. No. 4,352,539 uses a plastic housing 11, however the ballast 16 and bracket 23 appear to be metal. Finishing the housings usually requires additional plating and/or painting. The conductive nature of the housing also imposes severe safety requirements since the housings per se are conductive. It would be advantageous, from many points of view, if other materials could be used. Non-metal housings would:

(1) significantly reduce the weight of the finished assembly, (2) eliminate the necessity for additional plating and/or painting operations, thus reducing cost, (3) perhaps eliminate the necessity for potting, also reducing cost and weight.

Furthermore, a typical component in such an electrical assembly is a printed circuit (PC) board. Printed circuit boards have been used for years and perform two functions. They provide a means for supporting electrical componentry and they provide many if not all of the connections between that componentry. Conventional printed circuit boards are usually constructed of non-conductive material, typically in the form of a rectangular parallelepiped with upper and lower plane surfaces. Either or both of these surfaces may carry conductive traces, and the board usually also includes several holes (either plated or unplated) to both interconnect the conductive traces on the upper surface to the lower surface and, in other respects, to provide a mounting facility for electrical componentry.

The typical form of a printed circuit board is driven by cost parameters which include not only the cost of manufacturing the printed circuit board, but also the cost of using it in assembling the final product. The form of the printed circuit boards impacts the cost of assembly in that it has an impact on the ability to use automatic assembly techniques. It would be an advantage if the printed circuit board (which as now constituted is essentially a two-dimensional object) could have a three-dimensional characteristic, i.e. have integral components which extend above the upper plane surface for example. Such integral components would eliminate the necessity for attaching loose components to a two-dimensional printed circuit board.

SUMMARY OF THE INVENTION

Accordingly, it is an object of the invention to improve printed circuit boards by giving them a three-dimensional characteristic. More particularly, it is an object of the invention to provide a molded printed circuit board which is generally a rectangular parallelepiped having an upper relatively plane surface and a lower relatively plane surface, but in addition having integral components thereon which extend, for example, above the upper, relatively plane surface. Such integral components extending in this direction can be used for wire receptacles, module connectors and stand-offs. Having these components formed integral with the printed circuit board eliminates the necessity for attaching loose components to the printed circuit board to effect the required function.

It is another object of the present invention to provide an all plastic housing which is relatively simple to mold and which can be formed in two components for ease of assembly and then welded together to form a unitary housing which eliminates the necessity for potting.

Suitable materials for the PC board (and housing) are thermoplastics such as polyarylate, polyethylene, terephthalate, polyimide, polyamide, polyester, polyphenylene sulfone, polyether sulfur, polyether imide and modified polyphenylene oxide.

In an embodiment which will be described in detail, a PC board is a composite of two thermoplastics, a polyarylate and polyethylene terephthalate.

Accordingly, in accordance with one aspect the invention provides a three-dimensional printed circuit board comprising:
a core of a first thermoplastic material,
an overcoat of a second thermoplastic material,
conductive traces supported by said core and extending slightly above an upper surface of said overcoat,
said three-dimensional printed circuit board further comprising integral connectors and stand-offs extending significantly above said upper surface of said overcoat and an upper surface of said conductive traces.

The invention, in accordance with another aspect provides a fluorescent lamp ballast comprising:
an amorphous polyarylate plastic housing, said plastic housing comprising a base, two sidewalls a top and end walls, said sidewalls having a slot, interior of said housing for receiving and locating a PC board in a position elevated from an upper surface of said base, at least one end wall having an aperture for receiving a PC board connector component extending from an interior of said housing to an exterior of said housing,
a PC board mounted in slots of said housing components, said PC board comprising a core of an amorphous polyarylate with an overcoat of a polyester such as polyethylene terephthalate, said core supporting exposed conductive traces, said PC board also having integral connector components including a first connector component extending upwardly from an upper surface of said PC board and a second connector component extending from an end surface of said PC board, said second connector component extending through said aperture in said end wall, said conductive traces connecting electrical components of said ballast.

While a specific example described herein is a fluorescent lamp ballast, those skilled in the art will readily see that the invention can also be applied to housings for neon lamp power supplies, HID lamps, computer switching power supplies and electronic thermostats, among others. These housings in general support and enclose power conditioning electronics.

BRIEF DESCRIPTION OF THE DRAWINGS

The invention will now be described in further detail so as to enable those skilled in the art to make and use the same in conjunction with the attached drawings wherein like reference characters identify identical apparatus and in which:

FIGS. 5, 6, 7 and 8 are top, side, end and bottom views of a PC board, in a first stage of manufacture, in accordance with the present invention;

FIG. 9 is a detail of a portion of the top view FIG. 5;

DESCRIPTION OF A PREFERRED EMBODIMENT

Figure 1:
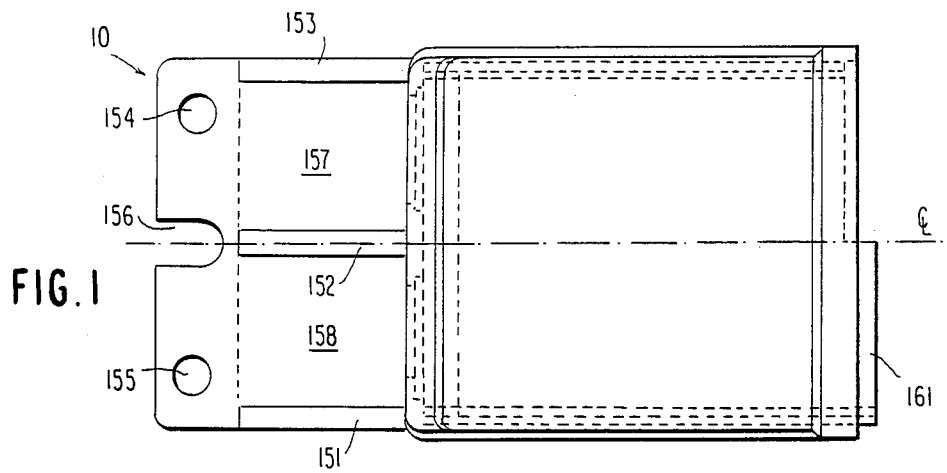
FIGS. 1–4 are top, side and end views of the thermoplastic housing component in accordance with the invention.
Figure 4:
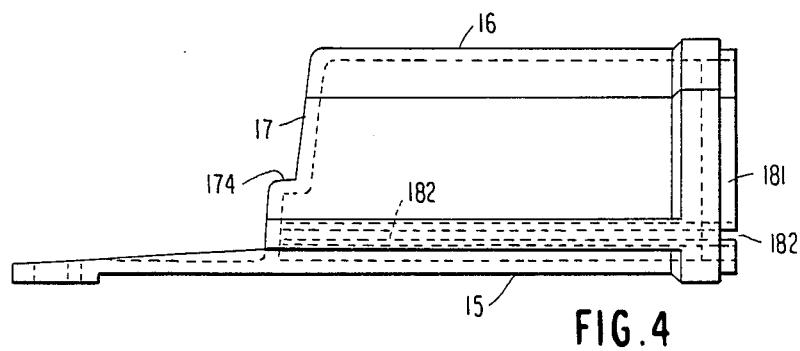
Figure 2:
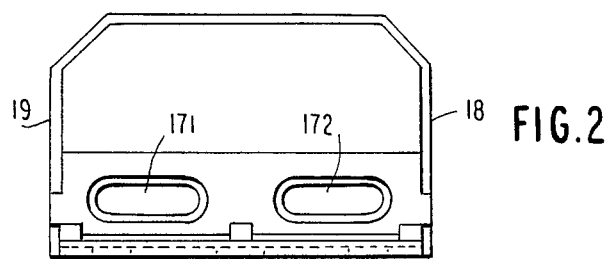
Figure 3:
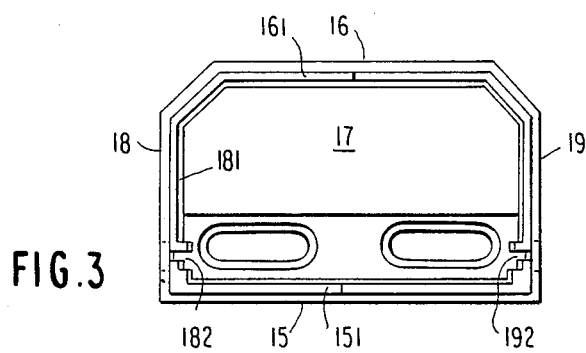

FIGS. 1 and 4 are respectively top and side views of a housing component 10 in accordance with the invention; FIGS. 2 and 3 are respectively back and front views of the same housing component 10. Preferably the housing component 10 is formed of a duPont thermoplastic Arylon which is an amorphous polyarylate and is more particularly described in "Polyarylate: The New Buildup to 'Workhorse' Status" by Wood in the July 1987 issue of *Modern Plastics*. Other thermoplastics such as those described above can also be used. The housing component 10 has a base or bottom 15, a top 16, an end wall 17 and side walls 18 and 19. As seen particularly in FIGS. 1 and 4 the base 15 extends beyond the end wall 17 in a relatively planar configuration with ridges 151–153 extending toward an end region including mounting holes 154 and 155 and a mounting slot 156.

The exterior shape of the side walls 18 and 19 are relatively vertical up to a point and then extend at an approximately 45° angle to the vertical to the top 16.

The end wall 17 extends substantially vertically downward from the top 16 and forms a ridge 174 and then extends downwardly from the ridge 174 to the base 15. Two elongated apertures 172 and 173 are located in the end wall 17 below the ridge 174 and are provided for wire receptacles or connector components of the printed circuit board (which will be described below) to extend through the end wall 17.

Interior of the housing component 10, the side walls 18 and 19 include slots 182 and 192, respectively. The slots 182 and 192 are provided to locate a PC board (to be described below) within the housing 10 so that the lower-most surface of the PC board is elevated above the upper-most surface of the base 15.

The top 16, side 18 and base 15 include extensions 161, 181 and 151, respectively. The extensions 161, 181 and 151 mate with corresponding recesses in an identical housing component 10 when the two are brought together for securely fastening two housing components 10 together to form a housing. After final assembly, that is after a PC board has been located within the slots 182 and 192, and two housing components 10 secured together, the entire unit can be welded, e.g. sonic welding, to form a secure, weather-resistant housing which is non-conductive and does not require any potting procedure for meeting weather and safety standards. The housing component 10 is arranged for manufacture by conventional plastic forming techniques.

Figure 15:
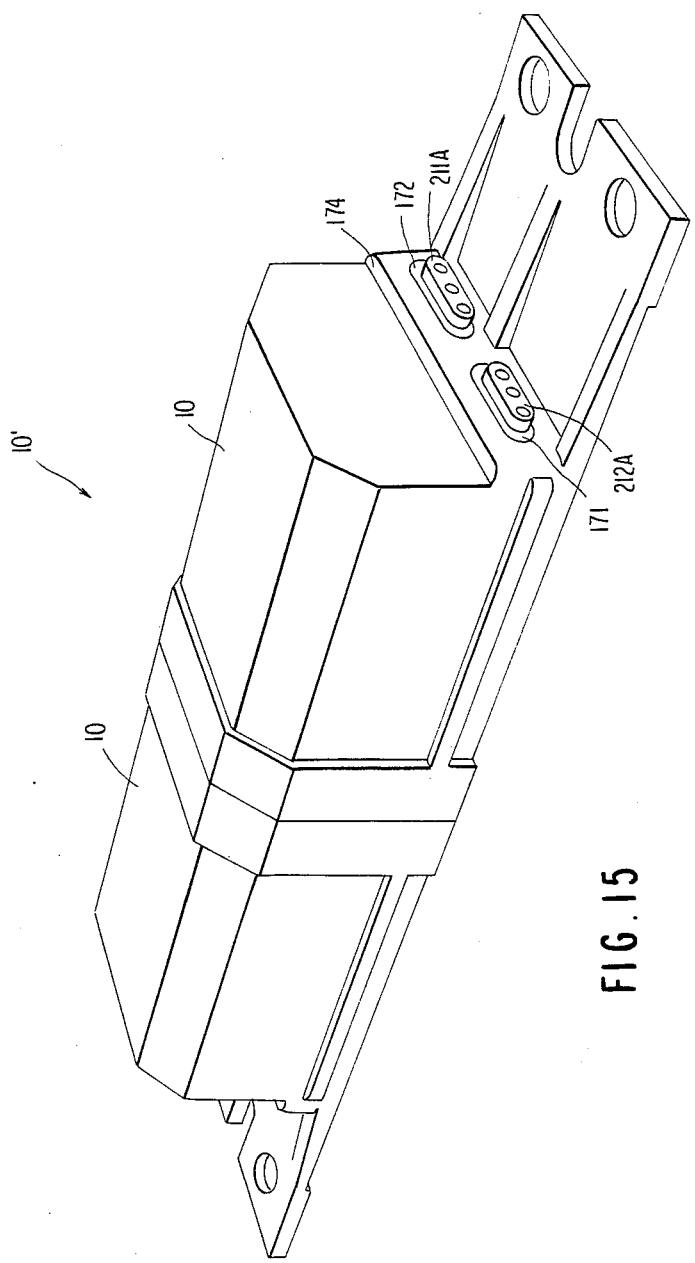
FIG. 15 is a three-dimensional view of an assembled housing.

FIG. 15 shows the assembled housing 10' including two housing components 10 with a populated printed circuit board 200 inserted.

FIGS. 5 and 6 are respectively a top and end view of a suitable PC board in an intermediate stage of manufacture (after molding but before deposition of conductive traces). FIG. 7 is a side view and illustrates the three-dimensional nature of the PC board. FIG. 8 is a bottom view and FIG. 9 is a detail of the region within the dashed circuit of FIG. 5. The PC board 200, as shown in FIGS. 5–7 includes a relatively planar upper surface 201 and a relatively planar lower surface 202. The PC board 200 is molded in two shots. In a first shot a core of Arylon is molded which has a surface pattern corresponding to the desired conductive pattern on the completed printed circuit board. The Arylon is catalyzed for reasons which will be described below. In a second shot, Rynite (described in U.S. Pat. Nos. 4,338,243; 4,352,904 and 4,486,654) is molded as an overcoat over the core Arylon. The PC board shown in FIGS. 5–9 is the state of the PC board after the second molding shot but prior to depositing the conductive traces.

With the PC board 200 in the form of FIGS. 5–9 (before deposition of conductive traces), the board is placed in a plating bath, such as an electroless bath. The catalyzed first shot (which is exposed in a desired pattern) attracts metal ions to form the conductive traces. After plating, the PC board has the form of FIGS. 11 and 12, for example.

The PC board 200 has four connectors 211–215; the connector 211 is shown in enlarged detail in FIG. 9. Each of the connectors 211–214 is identical and only one will be described. The connector 211 has a segment 211A (see FIG. 9) extending from an end of the PC board 200 as well as a segment 211B extending vertically upward from the upper surface 201 of the PC board 200. The connector segment 211A has three circular apertures 220, each for accepting a conductor. The aperture 220 in the segment 211A communicates with an adjacent cell 320 in the connector segment 211B, so that the conductor, extending through the aperture 220, extends into the cell 320. The cell 320 may include a conductive element (or such a conductive element may be absent). If a conductive element is present, it will be connected to conductive traces on the bottom surface 202 of the PC board 200. Since each of the connectors 211–214 has the capacity for connecting three conductors, the PC board 200, in toto, provides a connection for twelve different conductors.

Referring briefly to FIGS. 2 and 3, the connector segment 211A (or 212A-214A) is positioned so that when the PC board 200 is inserted within the housing formed by a pair of housing components 10, the connector segments 211A, 212A, 213A and 214A extend through the apertures 171 and 172 from interior of the housing, to the exterior of the housing. Accordingly, electrical connections can be made to electrical componentry within the housing, after the housing has been assembled and welded. This simplifies production in that it eliminates the necessity for loose connecting wires during assembly. Inasmuch as the connectors 211-214 are integrally molded in the course of producing the PC board 200, there are no "extra" steps required to fabricate the connectors.

Figure 13:
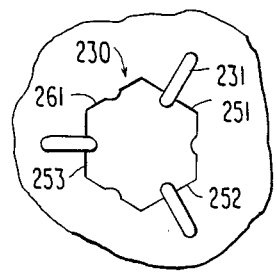
FIG. 13 is a detail of a different region of the top view of FIG. 5.

Referring back to FIG. 5, two apertures 230 and 240, each of hexagonal shape, are shown. FIG. 13 is a detail of that portion of the PC board 200 encompassing the aperture 230. Aperture 240 is in all respects similar to aperture 230. As shown in FIG. 13, the aperture 230 includes a first set of sides 251-253. Each of the apertures in this set is associated with a stand-off 231. As is shown more clearly in FIG. 7, each of the standoffs 231 extends above the upper surface 201 of the PC board 200. Furthermore, each of the stand-offs 231 protrudes into the aperture 230 in a position so as to overlie the aperture. FIG. 8 shows portions 231a of the stand-offs 231 protruding into the aperture 230. Referring back to FIG. 13, the aperture 230 includes a second set of sides 261-263. Each side in this set includes a protuberance such as the protuberance 232 which slightly extends into the space that would have been occupied by the aperture 230 had it been a perfect hexagon. Like the connectors 211-214, the stand-offs and protuberances 232 are an integral feature of the PC board 200 and produced at the time it is molded. The aperture 230, stand-offs 231 and protuberances 232 are used as follows. A threaded nut (which may be made of nylon for example) can be inserted into the aperture 230 from the bottom side 202 of the PC board 200. The soft threaded nut will tend to be retained in place by the frictional fit caused by the protuberances 232. An electrical component such as a coil is supported by the standoffs 231. The coil has a central opening into which a bolt with a threaded shaft is inserted. The threaded shaft is then engaged by the threaded nut, and tightened. Accordingly, the coil is then held in place. The coil is maintained above the surface 201 of the PC board 200 by the stand-offs 231, allowing for air cooling. The aperture 240 has stand-offs similar to stand-offs 231 and protuberances similar to the protuberances 232, all for the same purpose.

Figure 11:
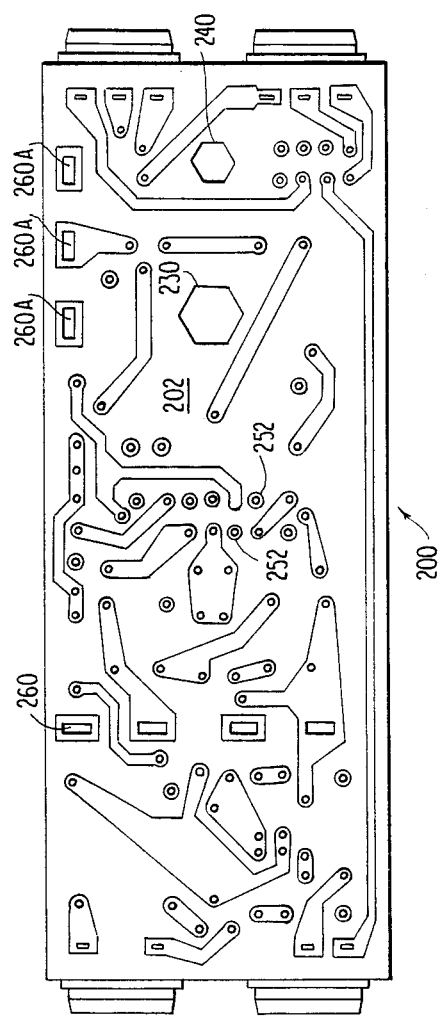
FIGS. 11 and 12 are respectively bottom and top views of a printed circuit board in accordance with the present invention at a different stage in manufacture.
Figure 12:
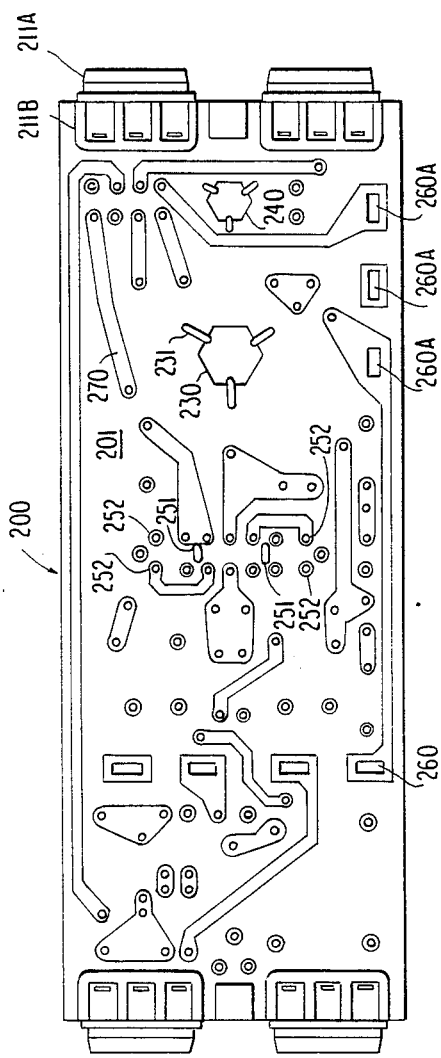

Before assembling electrical components to the PC board 200 (in the form in which it is shown in FIGS. 5-9) conductive traces are deposited on the surface 201 and on the surface 202. In order to effect this, the PC board 200 is placed in an electroless plating bath. Copper ions in the bath are attracted to the catalyzed Arylon and thus conductive traces are plated out in accordance with the Arylon pattern. The Rynite does not plate. FIGS. 11 and 12 are bottom and top views respectively of the PC board 200 after conductive traces 400 have been plated thereon.

FIG. 12 shows the top surface 201 of the PC board 200 after the conductive traces 270 have been applied. FIG. 12 also shows the apertures 230 and 240.

Another three-dimensional feature of the upper surface 201 of the PC board 200 is the two standoffs 251. Adjacent the standoffs 251 is a pair of rows of holes 252, the purposes for which will be described in connection with FIG. 10. Also shown in FIG. 12 are rectangular apertures 260 and 260A. Both the circular apertures, such as the apertures 252, and the rectangular apertures (260 and 260A) are plated through. That is, the conductive traces 270 which are adjacent the apertures have an appearance on the bottom surface 202 of the PC board 200. Referring briefly to FIG. 11, each of the rectangular apertures 260A is an extension of the aperture 260A of FIG. 12.

Figure 10:
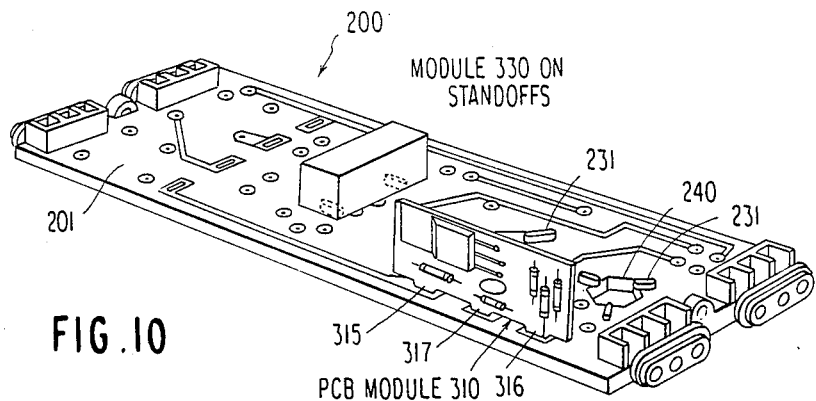
FIG. 10 is a three-dimensional view of the printed circuit board showing interconnected modules.
Figure 14:
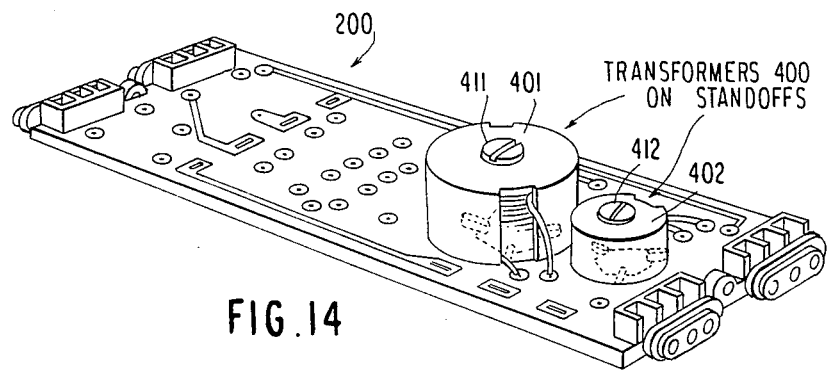
FIG. 14 is an illustration of printed circuit board 200, similar to FIG. 10 except showing installed transformers.

Refer now to FIG. 10, which shows a three-dimensional view of the PC board 200 with some additional electronic componentry attached. The electronic componentry includes a module 330 which is supported on the standoffs 251. The module includes pins which extend from the bottom surface of the module 330 (not illustrated) and enter one or more of the holes 251. FIG. 10 also shows a PCB module 310 with additional electronic componentry thereon. The PCB module 310 includes fingers 315-317 which engage the plated rectangular holes 60A. FIG. 14 is similar to FIG. 10 but shows transformers 401 and 402 installed on printed circuit board 200. FIGS. 10 and 14 are illustrated separately to show the various components. In an actual installation, both the transformers 401, 402, the modules 310, 330, as well as other components are installed on the printed circuit board 200. In the course of manufacture, the electronic componentry such as the modules 310 and 330 are physically inserted or assembled on the PC board 200. Thereafter, the assembly is conducted to a wave soldering machine. Molten solder in a bath of the wave soldering machine wicks from the bottom surface of the PC board 202 up the pins of the module 330 and the fingers 315-317 of the module 310 for forming a solid electrical and physical connection between the modules 310 and 330 and the PC board 200. Thus the advantage of the plated holes 260A in providing ready interconnection between the conductive traces on the PC board 200 and the PCB module 310 should be apparent. The standoffs 251 serve two purposes. In the first place, they physically support the module 330 above the upper surface 201 of the PC board 200. This allows the module 330 to include conductive traces on its lower surface, i.e. the surface facing the upper surface 201 of the PC board. By reason of the standoffs 251, air insulates the conductive traces on the lower surface of the module 330 from the conductive traces on the upper surface 201 of the PC board 200.

Once the PC board 200 has been assembled with the required componentry, and run through the wave soldering machine, it can be inserted into slots 182 and 192 of the housing component 10. A mating housing component 10 is then used to seal the PC board 200 within the interior space of the housing formed by the two housing components 10. The completed assembly can then be sonically welded, forming a weather resistant and structurally unitary housing.

Although a particular housing for a fluorescent lamp ballast has been described with reference to particular materials, the invention has wide applicability in housings for electrical componentry under severe service conditions. Accordingly, the invention is not to be construed by the example described herein but rather in accordance with the claims attached hereto.

I claim:

1. A metalless unpotted housing for an electronic power conditioning apparatus subject to heat generated by said apparatus, required to meet weather and shock standards, said housing comprising:
   a plurality of thermoplastic housing components fitted together to form a closed, integral housing, at least one of said thermoplastic housing components having an aperture for receiving a conductor receptacle,
   a three dimensional molded printed circuit board supported within said housing, said three dimensional molded printed circuit board having:
   a lower, generally plane surface, spaced from an interior, adjacent surface of said housing,
   a generally plane upper surface,
   at least one integrally molded feature extending above said upper generally plane surface of said printed circuit board,
   at least one integrally molded conductor receptacle extending from an interior of said housing to an exterior thereof, said integrally molded conductor receptacle including a conductor receiving aperture, and a fixed conductor extending from said conductor receiving aperture to a conductive trace on said printed circuit board.

2. A metalless unpotted housing for an electronic power conditioning apparatus as recited in claim 1 wherein said plurality of housing components include two, identical housing components.

3. A metalless unpotted housing for an electronic power conditioning apparatus as recited in claim 2 wherein said two housing components include several extensions arranged to fit into corresponding recesses when said housing components are brought together.

4. A metalless unpotted housing for an electronic power conditioning apparatus as recited in claim 1 wherein said housing components are formed of amorphous polyarylate and wherein said printed circuit board is formed of a composite of amorphous polyarylate and polyethylene terephthalate.

5. A housing for electronic power conditioning apparatus comprising:
   an amorphous thermoplastic housing, said thermoplastic housing comprising at least two housing components,
   each housing component including a base, two sidewalls, a top and an end wall,
   said sidewalls having a slot, interior of said housing component for receiving and locating a PC board in a position elevated from an upper surface of said base,
   said end wall having at least one aperture for receiving a PC board connector component extending from an interior of said housing component to an exterior of said housing component,
   a PC board mounted in slots of said housing components, said PC board comprising a core of a first thermoplastic and an overcoat of a second thermoplastic, said core supporting exposed conductive traces, said PC board also having integral connector components including a first connector component extending upwardly from an upper surface of said PC board and a second connector component extending from an end surface of said PC board, said second connector component extending through said aperture in said end wall.

6. A fluorescent lamp ballast as recited in claim 5 wherein said amorphous thermoplastic housing comprises polyarylate, said first thermoplastic comprises an amorphous polyarylate and said second thermoplastic comprises polyethylene terephthalate.

7. A fluorescent lamp ballast comprising:
   an amorphous polyarylate plastic housing, said plastic housing comprising a base, two sidewalls a top and end walls, said sidewalls having a slot, interior of said housing for receiving and locating a PC board in a position elevated from an upper surface of said base, at least one end wall having an aperture for receiving a PC board connector component extending from an interior of said housing to an exterior of said housing,
   a PC board mounted in slots of said housing components, said PC board comprising a core of an amorphous polyarylate with an overcoat of polyethylene terephthalate, said core supporting exposed conductive traces, said PC board also having integral connector components including a first connector component extending upwardly from an upper surface of said PC board and a second connector component extending from an end surface of said PC board, said second connector component extending through said aperture in said end wall, said conductive traces connecting electrical components of said ballast.

8. A fluorescent lamp ballast as recited in claim 7 wherein said housing comprises at least two housing components,
   each housing component including a base, two sidewalls, a top and an end wall and wherein each housing component includes a finger for engaging another housing component when the two housing components are brought together.

9. A fluorescent lamp ballast as recited in any of claims 5, 6, 7 or 8 wherein said PC board further comprises an aperture with plural sides, a first set of sides of said aperture having protuberances thereon, a second set of sides of said aperture each having a standoff associated therewith, each standoff being integral with said PC board and extending beyond an associated side of said aperture so that said standoffs overly said aperture,
   whereby an electrical component may be supported on said standoffs and secured to said PC board by a threaded shaft engaging a threaded nut press fit against said protuberances and located within said aperture.

10. A fluorescent lamp ballast as recited in claim 9 wherein said PC board further comprises a row of plated through holes and a plurality of standoffs aligned with said row of plated through holes,
    whereby an electrical circuit board may supported by said plurality of aligned standoffs to be insulated from said PC board with contact fingers extending into plated through holes of said row of plated through holes.

11. A fluorescent lamp ballast as recited in claim 9 wherein said PC board further comprises at least one rectangular, plated through aperture.

12. A fluorescent lamp ballast as recited in any of claims 5 or 6 or 8 wherein said housing components are welded together.

13. A fluorescent lamp ballast as recited in claim 12 wherein said PC board is welded to said housing.

14. A fluorescent lamp ballast relying solely on air insulation with an unpotted metalless housing comprising:

an amorphous polyarylate plastic housing, said plastic housing comprising a base, two sidewalls a top and end walls, said sidewalls having a slot, interior of said housing for receiving and locating a PC board in a position elevated from an upper surface of said base, at least one end wall having an aperture for receiving a PC board connector component extending from an interior of said housing to an exterior of said housing, a PC board mounted in slots of said housing components, said PC board comprising a core of an amorphous polyarylate with an overcoat of polyethylene terephthalate, said core supporting exposed conductive traces, said PC board also having integral connector components including a first connector component extending upwardly from an upper surface of said PC board and a second connector component extending from an end surface of said PC board, said second connector component extending through said aperture in said end wall, said conductive traces connecting electrical components of said ballast.

15. A fluorescent lamp ballast with an unpotted metalless housing as recited in claim 14 wherein said housing comprises at least two housing components welded together, each housing component including a base, two sidewalls, a top and an end wall and wherein each housing component includes a finger for engaging another housing component when the two housing components are brought together.

16. A fluorescent lamp ballast with an unpotted metalless housing as recited in claim 14 wherein said PC board further comprises an aperture with plural sides, a first set of sides of said aperture having protuberances thereon, a second set of sides of said aperture each having a standoff associated therewith, each standoff being integral with said PC board and extending beyond an associated side of said aperture so that said standoffs overly said aperture, whereby an electrical component may be supported on said standoffs and secured to said PC board by a threaded shaft engaging a threaded nut press fit against said protuberances and located within said aperture.

17. A fluorescent lamp ballast with an unpotted metalless housing as recited in claim 16 wherein said PC board further comprises a row of plated through holes and a plurality of standoffs aligned with said row of plated through holes, whereby an electrical circuit board may supported by said plurality of aligned standoffs to be insulated from said PC board with contact fingers extending into plated through holes of said or of plated through holes.

18. A fluorescent lamp ballast with an unpotted metalless housing as recited in claim 16 wherein said PC board further comprises at least one rectangular, plated through aperture.

19. A fluorescent lamp ballast with an unpotted metalless housing as recited in claim 15 wherein said PC board is welded to said housing.

20. A three dimensional printed circuit board comprising:

a core of a first thermoplastic material, an overcoat of a second thermoplastic material, conductive traces supported by said core and extending slightly above an upper surface of said overcoat, said three dimensional printed circuit board further comprising integral connectors and standoffs extending significantly above said upper surface of said overcoat and an upper surface of said conductive traces.

21. A three dimensional printed circuit board as recited in claim 20 and further comprising:

an aperture with plural sides, a first set of sides of said aperture having protuberances thereon, a second set of sides of said aperture each having a standoff associated therewith, each standoff being integral with said PC board and extending beyond an associated side of said aperture so that said standoffs overly said aperture, whereby an electrical component may be supported on said standoffs and secured to said PC board by a threaded shaft engaging a threaded nut press fit against said protuberances and located within said aperture.

22. A three dimensional printed circuit board as recited in claim 21 and further comprising a row of plated through holes and a plurality of standoffs aligned with said row of plated through holes, whereby an electrical circuit board may be supported by said plurality of aligned standoffs to be insulated from said PC board with contact fingers extending into plated through holes of said row of plated through holes.

23. A three dimensional printed circuit board as recited in claim 20 wherein said first thermoplastic material is an amorphous polyarylate and wherein said second thermoplastic material is polyethylene terephthalate.

* * * * *